(12) United States Patent
Yu et al.

(10) Patent No.: US 11,439,002 B2
(45) Date of Patent: Sep. 6, 2022

(54) INTER-LAYER SLOT FOR INCREASING PRINTED CIRCUIT BOARD POWER PERFORMANCE

(71) Applicant: NVIDIA CORPORATION, Santa Clara, CA (US)

(72) Inventors: Mingyi Yu, Saratoga, CA (US); Ananta H. Attaluri, San Jose, CA (US); Gregory Patrick Bodi, Santa Cruz, CA (US); Carmen A. Capillo, Jr., Hollister, CA (US); Michael James Warner, Fort Mill, SC (US)

(73) Assignee: NVIDIA Corporation, Santa Clara, CA (US)

( * ) Notice: Subject to any disclaimer, the term of this patent is extended or adjusted under 35 U.S.C. 154(b) by 0 days.

(21) Appl. No.: 17/081,916

(22) Filed: Oct. 27, 2020

(65) Prior Publication Data

US 2021/0127479 A1 Apr. 29, 2021

Related U.S. Application Data (60) Provisional application No. 62/927,107, filed on Oct. 28, 2019.

(51) Int. Cl.
*H05K 1/02* (2006.01)
*H05K 3/00* (2006.01)
*H05K 3/42* (2006.01)

(52) U.S. Cl.
CPC ......... *H05K 1/0218* (2013.01); *H05K 1/0228* (2013.01); *H05K 3/0029* (2013.01); *H05K 3/423* (2013.01); *H05K 2201/09954* (2013.01)

(58) Field of Classification Search
CPC ......................................... H05K 1/0218–0227
See application file for complete search history.

(56) References Cited

U.S. PATENT DOCUMENTS

| | | | | |
|---|---|---|---|---|
| 5,828,555 A | * | 10/1998 | Itoh ...................... | H05K 1/0221 361/784 |
| 6,747,216 B2 | * | 6/2004 | Brist .................... | H05K 1/0206 174/255 |
| 7,427,718 B2 | * | 9/2008 | Ng ....................... | H05K 1/0224 174/255 |
| 2002/0130739 A1 | * | 9/2002 | Cotton ................. | H05K 1/0221 333/238 |

* cited by examiner

*Primary Examiner* — Jeremy C Norris
(74) *Attorney, Agent, or Firm* — Artegis Law Group, LLP (57) ABSTRACT

A printed circuit board includes a first voltage plane disposed on a first surface of a first electrically insulating layer and a second voltage plane. An inter-layer slot that is formed through the first electrically insulating layer and includes an electrically conductive material electrically couples the first voltage plane to the second voltage plane.

22 Claims, 7 Drawing Sheets

INTER-LAYER SLOT FOR INCREASING PRINTED CIRCUIT BOARD POWER PERFORMANCE

CROSS-REFERENCE TO RELATED APPLICATIONS

This application claims priority benefit of the United States Provisional Patent Application titled, "MULTI-LAYER LASER SLOT FOR INCREASING PRINTED CIRCUIT BOARD POWER PERFORMANCE," filed on Oct. 28, 2019 and having Ser. No. 62/927,107. The subject matter of this related application is hereby incorporated herein by reference.

BACKGROUND

Field of the Various Embodiments

The various embodiments relate generally to computer systems and computer architecture and, more specifically, to an inter-layer slot for increasing printed circuit board power performance.

Description of the Related Art

Power efficiency is an important aspect of most, if not all, computing device designs. For mobile computing devices, greater power efficiency conserves limited battery power, which extends battery life and the utility of the mobile computing device. Further, in computing devices that include high-power processors, such as a central processing unit (CPU) or a graphics processing units (GPU), greater power efficiency can improve the overall performance of the processor. In that regard, to prevent thermal damage to high-power processors during operation, clock-speed throttling is oftentimes implemented when the operating temperatures of the processors exceed certain thresholds. Thus, the ultimate processing speeds of many processors are oftentimes constrained by operating temperature. With greater power efficiency, however, the heat generated by the overall IR drop in a given processor can be reduced, which enables the overall processing speed of the processor to be increased.

As alluded to above, a significant source of power loss for a high-power processor mounted on a printed circuit board (PCB) is the IR drop that occurs between the processor and a power source mounted on the PCB. Because many processors are designed to use hundreds of Watts of power, large IR drops within PCBs can be a major source of processor heat generation during operation. To reduce such IR drop, current flow between a high-power processor and an associated power source can be distributed over a greater volume of conductive material within the PCB via a power plane, which distributes power throughout the PCB with an electrical resistance that is less than the electrical resistance normally associated with multiple individual power leads. However, as power requirements for processors start to exceed 300 W, the electrical resistance of a single power plane in a PCB can still be greater than desired. In addition, due to lower voltages and higher total power used in many advanced processors, the magnitude of current flows within PCBs continues to increase, thereby further increasing IR drops within PCBs. Consequently, PCBs for certain processors have been configured with multiple power planes formed from different layers of the PCB. For example, portions of an interconnect layer of a PCB can be employed as a second planar conductor that acts as a second power plane through which current flow from a power supply to a processor can be distributed.

One drawback to using multiple power planes within a single PCB to distribute current is that the electrical connection between two different conductive layers within a PCB can actually erode the benefits of having additional conductive layers within the PCB. More specifically, the microvias formed between parallel conductive layers of a PCB have relatively small cross-sectional areas and, therefore can introduce a significant amount of additional electrical resistance to the overall circuit. As a result, adding power planes within a PCB has limited effectiveness in reducing the IR drop within a PCB between a processor and a power supply. To compensate for the additional electrical resistance introduced by microvias, the number of power planes within a PCB can be increased, but such an approach requires more total layers within the PCB, which increases the thickness of the PCB and the complexity of the manufacturing process.

As the foregoing illustrates, what is needed in the art are more effective ways to improve the power characteristics of printed circuit boards.

SUMMARY

A printed circuit board includes a first voltage plane disposed on a first surface of a first electrically insulating layer and a second voltage plane. An inter-layer slot that is formed through the first electrically insulating layer and includes an electrically conductive material electrically couples the first voltage plane to the second voltage plane.

At least one technical advantage of the disclosed printed circuit board design relative to the prior art is that the disclosed printed circuit board design provides reduced electrical resistance between conductive layers within the printed circuit board, such as two voltage planes that operate at the same voltage. The reduced electrical resistance reduces both the amount of power lost and the amount of heat generated when current flows through the two voltage planes during operation. These technical advantages provide one or more technological advancements over prior art approaches.

BRIEF DESCRIPTION OF THE DRAWINGS

So that the manner in which the above recited features of the various embodiments can be understood in detail, a more particular description of the inventive concepts, briefly summarized above, may be had by reference to various embodiments, some of which are illustrated in the appended drawings. It is to be noted, however, that the appended drawings illustrate only typical embodiments of the inventive concepts and are therefore not to be considered limiting of scope in any way, and that there are other equally effective embodiments.

For clarity, identical reference numbers have been used, where applicable, to designate identical elements that are common between figures. It is contemplated that features of one embodiment may be incorporated in other embodiments without further recitation.

DETAILED DESCRIPTION

In the following description, numerous specific details are set forth to provide a more thorough understanding of the various embodiments. However, it will be apparent to one of skilled in the art that the inventive concepts may be practiced without one or more of these specific details.

Overview

According to various embodiments, in a printed circuit board (PCB), an inter-layer slot is formed through an electrically insulating layer of the PCB and includes an electrically conductive material that electrically couples a first voltage plane of the PCB to a second voltage plane of the PCB. In lieu of microvias, which have relatively small cross-sectional areas, the inter-layer slot serves as an electrical connection between the first voltage plane and the second voltage plane that has a large cross-sectional area. As a result, power loss due to the IR drop between a processor mounted on the PCB and a power supply mounted on the PCB is reduced. In some embodiments, the first voltage plane and the second voltage plane are power planes, and in other embodiments, the first voltage plane and the second voltage plane are ground planes.

System Overview

Figure 1:
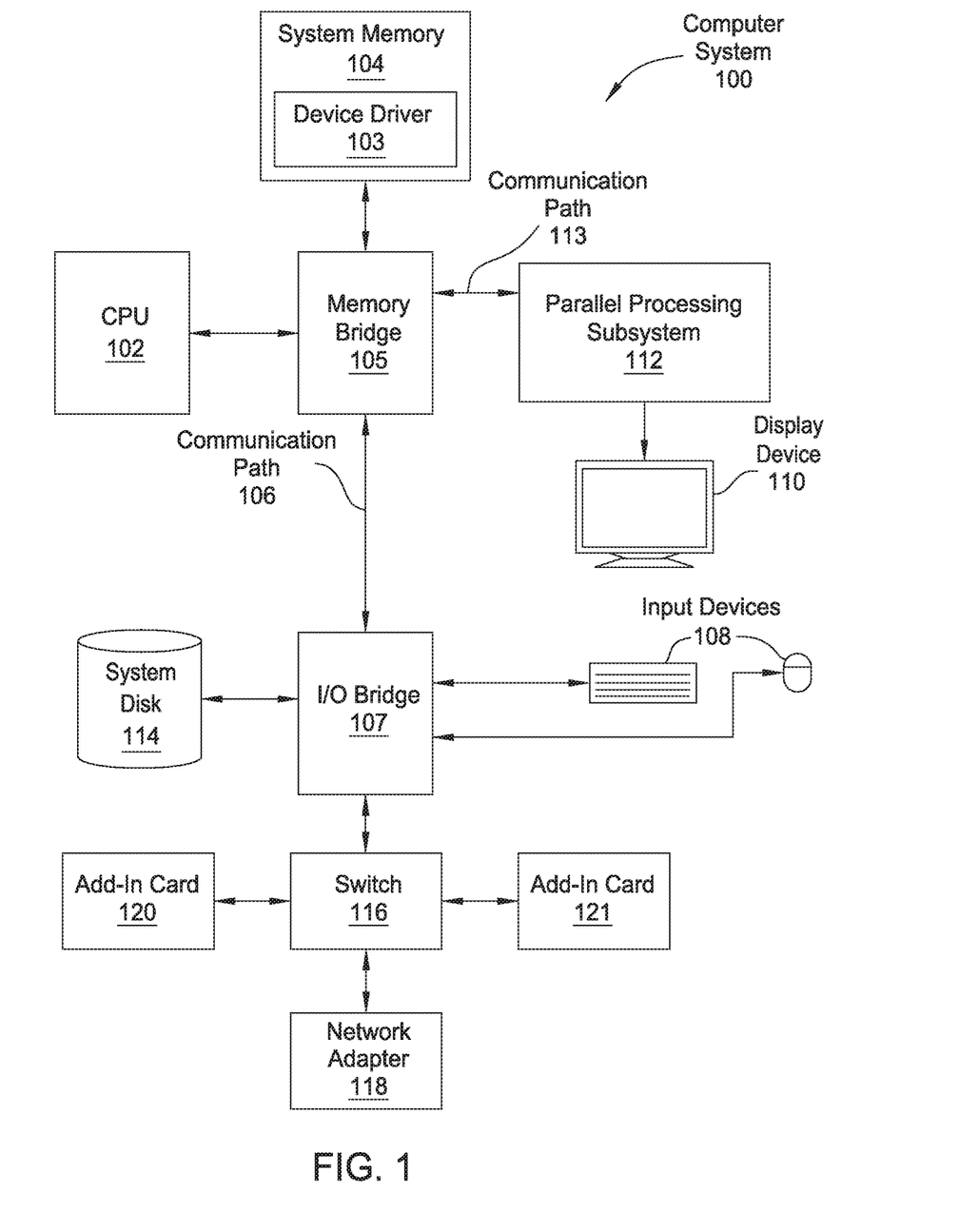
FIG. 1 is a conceptual illustration of a computer system configured to implement one or more aspects of the various embodiments.

FIG. 1 is a conceptual illustration of a computer system 100 configured to implement one or more aspects of the various embodiments. As shown, system 100 includes a central processing unit (CPU) 102 and a system memory 104 communicating via a bus path that may include a memory bridge 105. CPU 102 includes one or more processing cores, and, in operation, CPU 102 is the master processor of system 100, controlling and coordinating operations of other system components. System memory 104 stores software applications and data for use by CPU 102. CPU 102 runs software applications and optionally an operating system. Memory bridge 105, which may be, e.g., a Northbridge chip, is connected via a bus or other communication path (e.g., a HyperTransport link) to an I/O (input/output) bridge 107. I/O bridge 107, which may be, e.g., a Southbridge chip, receives user input from one or more user input devices 108 (e.g., keyboard, mouse, joystick, digitizer tablets, touch pads, touch screens, still or video cameras, motion sensors, and/or microphones) and forwards the input to CPU 102 via memory bridge 105.

A display processor 112 is coupled to memory bridge 105 via a bus or other communication path (e.g., a PCI Express, Accelerated Graphics Port, or HyperTransport link); in one embodiment display processor 112 is a graphics subsystem that includes at least one graphics processing unit (GPU) and graphics memory. Graphics memory includes a display memory (e.g., a frame buffer) used for storing pixel data for each pixel of an output image. Graphics memory can be integrated in the same device as the GPU, connected as a separate device with the GPU, and/or implemented within system memory 104.

Display processor 112 periodically delivers pixels to a display device 110 (e.g., a screen or conventional CRT, plasma, OLED, SED or LCD based monitor or television). Additionally, display processor 112 may output pixels to film recorders adapted to reproduce computer generated images on photographic film. Display processor 112 can provide display device 110 with an analog or digital signal. In various embodiments, a graphical user interface is displayed to one or more users via display device 110, and the one or more users can input data into and receive visual output from the graphical user interface.

A system disk 114 is also connected to I/O bridge 107 and may be configured to store content and applications and data for use by CPU 102 and display processor 112. System disk 114 provides non-volatile storage for applications and data and may include fixed or removable hard disk drives, flash memory devices, and CD-ROM, DVD-ROM, Blu-ray, HD-DVD, or other magnetic, optical, or solid state storage devices.

A switch 116 provides connections between I/O bridge 107 and other components such as a network adapter 118 and various add-in cards 120 and 121. Network adapter 118 allows system 100 to communicate with other systems via an electronic communications network, and may include wired or wireless communication over local area networks and wide area networks such as the Internet.

Other components (not shown), including USB or other port connections, film recording devices, and the like, may also be connected to I/O bridge 107. For example, an audio processor may be used to generate analog or digital audio output from instructions and/or data provided by CPU 102, system memory 104, or system disk 114. Communication paths interconnecting the various components in FIG. 1 may be implemented using any suitable protocols, such as PCI (Peripheral Component Interconnect), PCI Express (PCI-E), AGP (Accelerated Graphics Port), HyperTransport, or any other bus or point-to-point communication protocol(s), and connections between different devices may use different protocols, as is known in the art.

In one embodiment, display processor 112 incorporates circuitry optimized for graphics and video processing, including, for example, video output circuitry, and constitutes a graphics processing unit (GPU). In another embodiment, display processor 112 incorporates circuitry optimized for general purpose processing. In yet another embodiment, display processor 112 may be integrated with one or more other system elements, such as the memory bridge 105, CPU 102, and I/O bridge 107 to form a system on chip (SoC). In still further embodiments, display processor 112 is omitted and software executed by CPU 102 performs the functions of display processor 112.

Pixel data can be provided to display processor 112 directly from CPU 102. In some embodiments, instructions and/or data representing a scene are provided to a render farm or a set of server computers, each similar to system 100, via network adapter 118 or system disk 114. The render farm generates one or more rendered images of the scene using the provided instructions and/or data. These rendered images may be stored on computer-readable media in a digital format and optionally returned to system 100 for display. Similarly, stereo image pairs processed by display processor 112 may be output to other systems for display, stored in system disk 114, or stored on computer-readable media in a digital format.

Alternatively, CPU 102 provides display processor 112 with data and/or instructions defining the desired output images, from which display processor 112 generates the pixel data of one or more output images, including characterizing and/or adjusting the offset between stereo image pairs. The data and/or instructions defining the desired output images can be stored in system memory 104 or graphics memory within display processor 112. In an embodiment, display processor 112 includes 3D rendering capabilities for generating pixel data for output images from instructions and data defining the geometry, lighting shading, texturing, motion, and/or camera parameters for a scene. Display processor 112 can further include one or more programmable execution units capable of executing shader programs, tone mapping programs, and the like.

Further, in other embodiments, CPU 102 or display processor 112 may be replaced with or supplemented by any technically feasible form of processing device configured process data and execute program code. Such a processing device could be, for example, a central processing unit (CPU), a graphics processing unit (GPU), an application-specific integrated circuit (ASIC), a field-programmable gate array (FPGA), and so forth. In various embodiments any of the operations and/or functions described herein can be performed by CPU 102, display processor 112, or one or more other processing devices or any combination of these different processors.

CPU 102, render farm, and/or display processor 112 can employ any surface or volume rendering technique known in the art to create one or more rendered images from the provided data and instructions, including rasterization, scanline rendering REYES or micropolygon rendering, ray casting, ray tracing, image-based rendering techniques, and/or combinations of these and any other rendering or image processing techniques known in the art.

In other contemplated embodiments, system 100 may or may not include other elements shown in FIG. 1. System memory 104 and/or other memory units or devices in system 100 may include instructions that, when executed, cause the robot or robotic device represented by system 100 to perform one or more operations, steps, tasks, or the like.

It will be appreciated that the system shown herein is illustrative and that variations and modifications are possible. The connection topology, including the number and arrangement of bridges, may be modified as desired. For instance, in some embodiments, system memory 104 is connected to CPU 102 directly rather than through a bridge, and other devices communicate with system memory 104 via memory bridge 105 and CPU 102. In other alternative topologies display processor 112 is connected to I/O bridge 107 or directly to CPU 102, rather than to memory bridge 105. In still other embodiments, I/O bridge 107 and memory bridge 105 might be integrated into a single chip. The particular components shown herein are optional; for instance, any number of add-in cards or peripheral devices might be supported. In some embodiments, switch 116 is eliminated, and network adapter 118 and add-in cards 120, 121 connect directly to I/O bridge 107.

Figure 2:
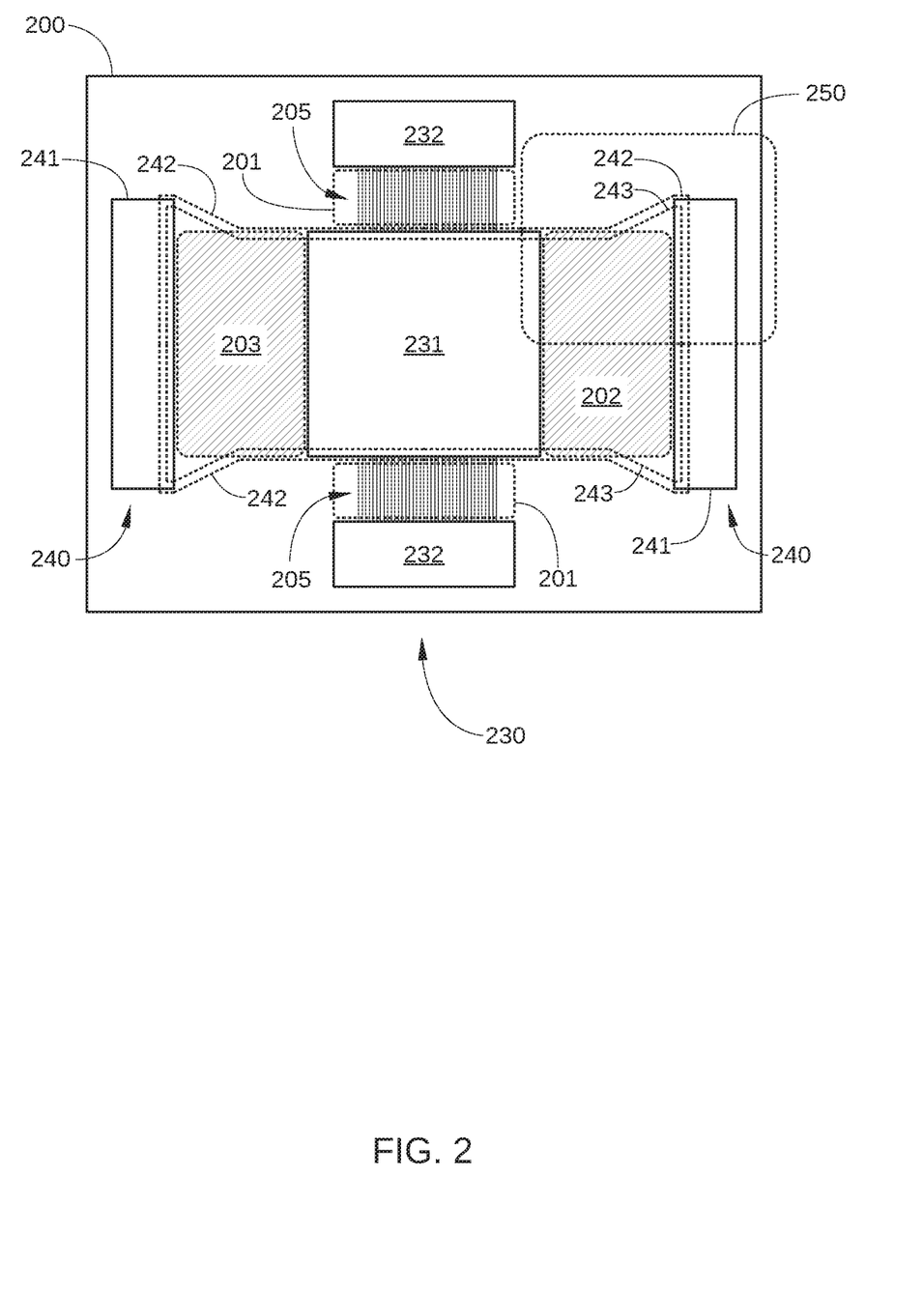
FIG. 2 is a schematic illustration of a printed circuit board with multiple integrated circuits and electronic devices mounted thereon, according to various embodiments.

FIG. 2 is a schematic illustration of a PCB 200 with multiple integrated circuits 230 and electronic devices 240 mounted thereon, according to various embodiments. In the embodiment illustrated in FIG. 2, integrated circuits 230 include a processor 231 and memory devices 232. Processor 231 can be a high-powered processor, such as CPU 102 and/or display processor 112 of FIG. 1, or any other technically feasible processor or integrated circuit. In the embodiment illustrated in FIG. 2, electronic devices 240 include one or more power regulators 241 or other power-supplying devices. In some embodiments, electronic devices 240 further include other electronic devices that may be mounted on PCB 200, such as capacitors, resistors, and the like.

PCB 200 includes two power planes 242 and 243 (dashed lines), which are disposed within PCB 200. As shown, processor 231 is electrically coupled to power regulators 241 via power plane 242 and/or power plane 243. In some embodiments, power plane 242 and/or power plane 243 also electrically couples one or more memory devices 232 to power regulators 241. In the embodiment illustrated in FIG. 2, PCB 200 includes a total of two power planes that are each electrically coupled to one or more of power regulators 241. In other embodiments, PCB 200 includes three or more power planes that are each electrically coupled to one or more of power regulators 241.

In some embodiments, processor 231 is communicatively coupled to memory devices 232 via interconnects 205, which are formed in one or more interconnect layers (not shown) within PCB 200. In the embodiment illustrated in FIG. 2, interconnects 205 are disposed in a region or regions 201 of PCB 200 between processor 231 and a memory device 232. Alternatively or additionally, in some embodiments, interconnects 205 are disposed in other regions of PCB 200, such as fan-out region 202 and/or fan-out region 203 (cross-hatched). Fan-out region 202 and fan-out region 203 are regions of PCB 200 that enable routing of signal traces and/or other interconnects that are coupled to processor 231 from the dense pin area under processor 231 to the much less densely routed final destination of the signal traces. Interconnects and signal traces disposed in fan-out regions 202 and 203 are omitted in FIG. 2 for clarity.

Power plane 242 and power plane 243 are each formed from a layer of conductive material, such as copper. Power plane 242 and power plane 243 are each a different layer of PCB 200 and, according to various embodiments described herein, are electrically coupled via one or more inter-layer slots. In some embodiments, the inter-layer slots are disposed in a region 250 of PBC 200 that is located between processor 231 and one or both of power regulators 241. An embodiment of such inter-layer slots is described below in conjunction with FIGS. 3-5.

Inter-Layer Slots

Figure 3:
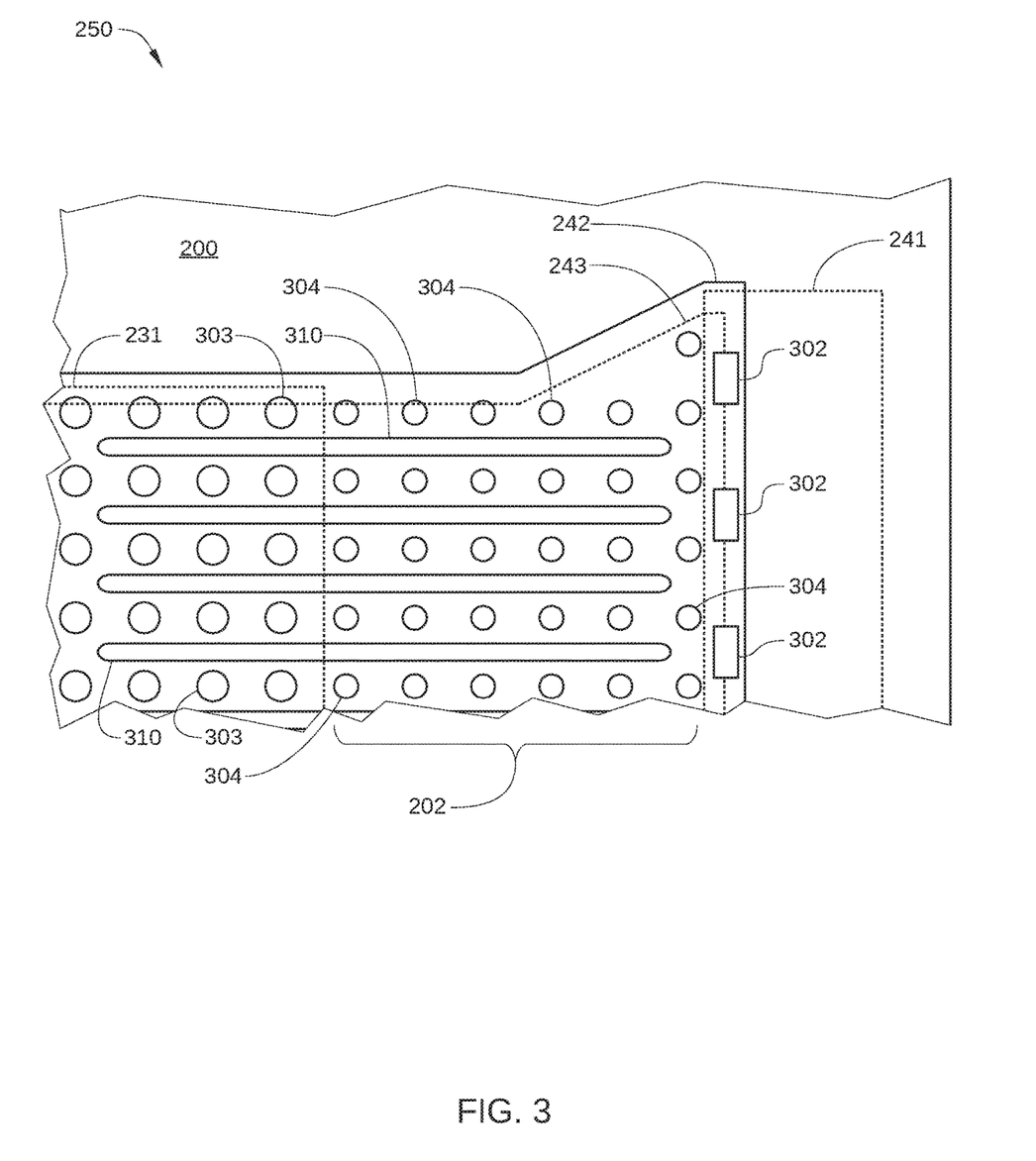
FIG. 3 is a more detailed illustration of a region of the printed circuit board of FIG. 2, according to various embodiments.

FIG. 3 is a more detailed illustration of region 250 of PCB 200, according to various embodiments. Power plane 242, fan-out region 202, and inter-layer slots 310 are shown in FIG. 3. For reference, power plane 243, processor 231, and one of power regulators 241 are also shown. Because processor 231 and power regulator 241 are mounted on a surface of PCB 200 and power plane 243 is formed from a different layer of PCB 200 than power plane 242, processor 231, power regulator 241, and power plane 243 are shown as dashed lines.

Power plane 242 and power plane 243 are each an electrically conductive layer formed within PCB 200, such as an electroplated copper layer or a layer of any other suitable electrically conductive material. In the embodiment illustrated in FIG. 3, power plane 242 electrically couples processor 231 to power regulator 241 via one or more electrical connections 302 associated with power regulator 241 and one or more microvias 303 disposed proximate processor 231.

As shown, one or more inter-layer slots 310 is configured to electrically couple power plane 242 with power plane 243. Inter-layer slots 310 are formed in one or more dielectric layers (not shown) of PCB 200, and include one or more electrically conductive materials, such as electroplated copper, solder, and/or the like. In general, the dielectric layers are a laminate material that form one or more layers of PBC 200. In some embodiments, inter-layer slots 310 are completely or substantially filled with the one or more electrically conductive materials. In some embodiments, inter-layer slots 310 are filled with the one or more electrically conductive materials with the exception of occasional and/or small voids. In such embodiments, inter-layer slots 310 are generally 90% or more filled with the one or more electrically conductive materials. In some embodiments, inter-layer slots 310 are formed via a non-conductive via fill (NCVF) process, and include both dielectric material and electrically conductive material. In the view illustrated in FIG. 3, inter-layer slots 310 are disposed between power plane 242 and power plane 243 and extend into the page.

In some embodiments, inter-layer slots 310 are located in fan-out region 202. In such embodiments, inter-layer slots 310 are positioned between rows of microvias 304. Typically, microvias 304 are configured to electrically couple signal traces (not shown) in one layer of PCB 200 to signal traces of another layer of PCB 200. Alternatively or additionally, in some embodiments, inter-layer slots 310 are located in a region of PCB 200 that is proximate processor 231 and is occupied with a plurality of microvias 303. In such embodiments, inter-layer slots 310 are positioned between rows of microvias 303. Typically, each microvia 303 is configured to electrically couple a solder ball (not shown) of processor 231 to a particular signal trace (not shown) or power plane of PCB 200. Various embodiments of inter-layer slots 310 are described below in conjunction with FIGS. 4 and 5.

Figure 4:
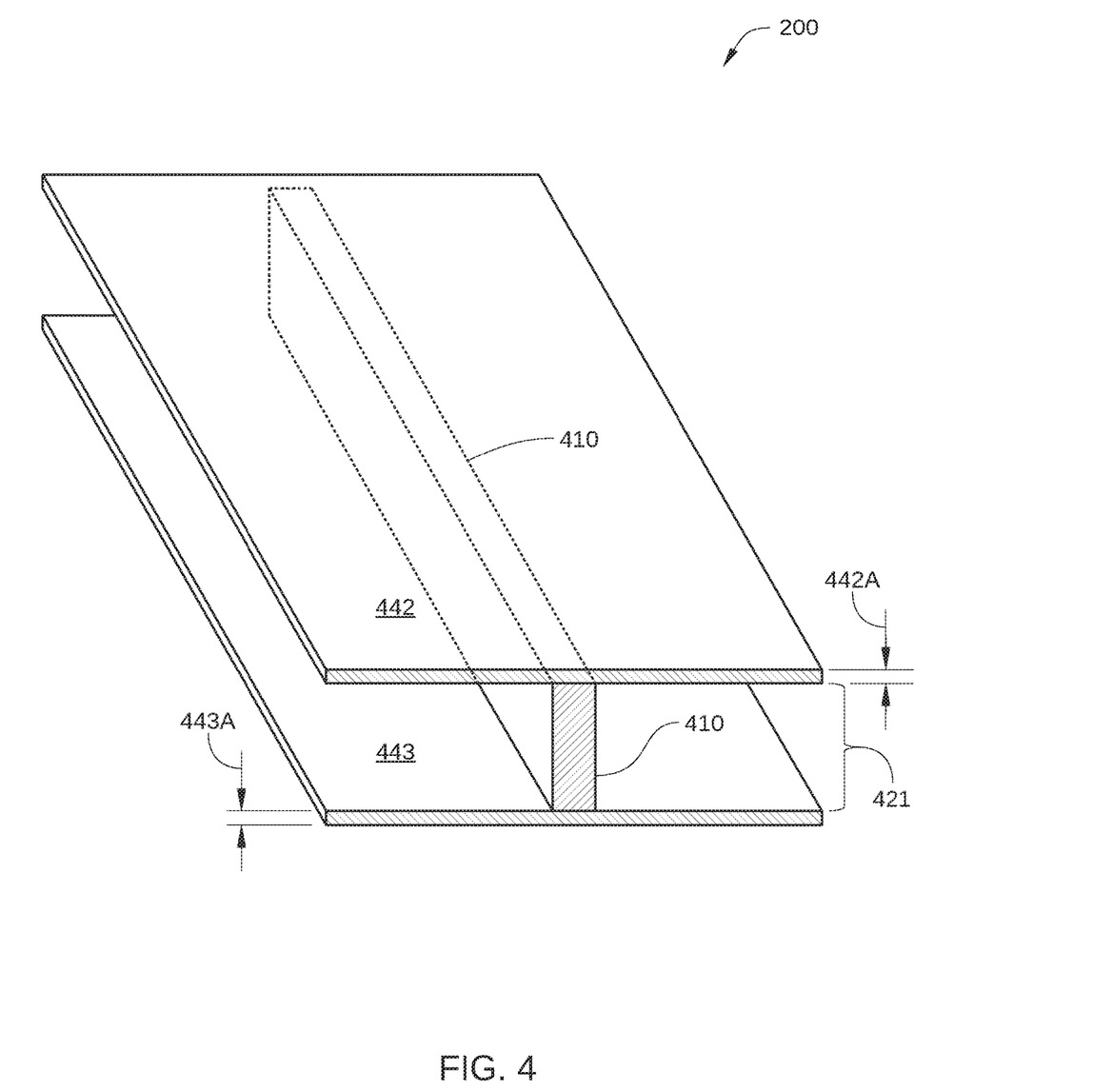
FIG. 4 is a perspective view of an inter-layer slot, according to various embodiments.

FIG. 4 is a perspective view of an inter-layer slot 410, according to various embodiments. As shown, inter-layer slot 410 electrically couples a first voltage plane 442 and second voltage plane 443 of PCB 200. In some embodiments, first voltage plane 442 and second voltage plane 443 can be implemented as two power planes of PCB 200, such as power plane 242 and power plane 243 in FIGS. 2 and 3. Alternatively or additionally, in some embodiments, first voltage plane 442 and second voltage plane 443 can be implemented as two ground planes of PCB 200. Alternatively or additionally, in some embodiments, first voltage plane 442 and second voltage plane 443 can be implemented as any two voltage planes of PCB 200 that are configured to operate at the same voltage.

In some embodiments, first voltage plane 442 and/or second voltage plane 443 may each be formed from a conductive layer of PCB 200 that also includes one or more signal traces. In such embodiments, a voltage plane that includes signals traces is generally thinner than a voltage plane that includes no signal traces. For example, in one such embodiment, first voltage plane 442 is a power plane and has a first thickness 442A. By contrast, in the embodiment, second voltage plane 443 is formed from a conductive layer of PCB 200 that includes signal traces and/or other interconnects, and has a second thickness 443A that is significantly thinner than first thickness 442A. For instance, in some embodiments, first thickness 442A is on the order of about two times second thickness 443A.

In the embodiment illustrated in FIG. 4, inter-layer slot 410 spans a single laminate layer 421 of PCB 200. For clarity, the position of laminate layer 421 is indicated, but laminate layer 421 is not shown in FIG. 4. It is noted that inter-layer slot 410 electrically connects first voltage plane 442 and second voltage plane 443 to each other with significantly less electrical resistant than multiple microvias formed between first voltage plane 442 and second voltage plane 443. Consequently, there is very little IR drop associated with current flowing from first voltage plane 442 to second voltage plane 443 and vice versa. As a result, the power efficiency of PCB 200 is significantly increased compared to a PCB in which first voltage plane 442 and second voltage plane 443 are electrically coupled via one or more microvias. Further, less heat is generated during operation than a PCB in which first voltage plane 442 and second voltage plane 443 are electrically coupled via one or more microvias.

Figure 5:
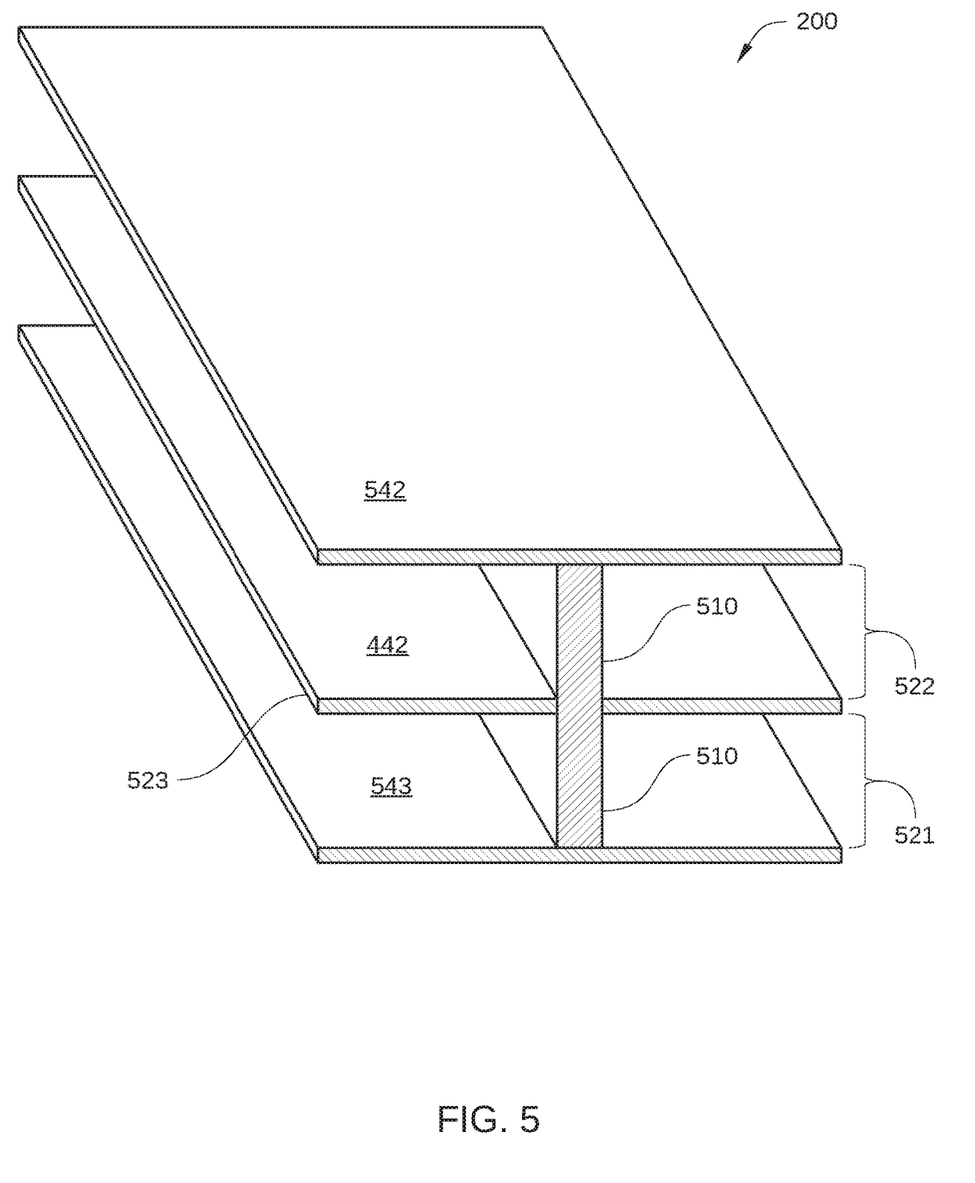
FIG. 5 is a perspective view of an inter-layer slot, according to various embodiments.

FIG. 5 is a perspective view of an inter-layer slot 510, according to various embodiments. As shown, inter-layer slot 510 electrically couples a first voltage plane 542 and second voltage plane 543 of PCB 200, where first voltage plane 542 and second voltage plane 543 are separated by multiple laminate layers of PCB 200. In some embodiments, first voltage plane 542 and second voltage plane 543 can be implemented as two power planes of PCB 200, two ground planes of PCB 200, and/or any two voltage planes of PCB 200 that are configured to operate at the same voltage.

In the embodiment illustrated in FIG. 5, inter-layer slot 510 spans multiple laminate layers 521 and 522 of PCB 200. For clarity, the positions of laminate layer 521 and 522 are indicated, but laminate layers 521 and 522 are not shown in FIG. 5. In some embodiments, inter-layer slot 510 further spans one or more electrically conductive layers of PCB 200, such as an interconnect layer 523 that includes signal traces.

In some embodiments, inter-layer slot 510 is formed with a single material removal process and a single filling process. For example, in one such embodiment, material is removed from laminate layer 521, laminate layer 522, and interconnect layer 523 in one process to form a multi-layer trench. Suitable material removal processes include a laser ablation process, a mechanical drilling process, and a mechanical routing process. In the embodiment, the multi-layer trench is then filled in a single multi-layer material deposition process, such as a copper electroplating process.

In some embodiments, inter-layer slot 510 is formed with multiple material removal processes and/or multiple filling processes. For example, in one such embodiment, material is removed from laminate layer 521 in a first material removal process to form a first single-layer trench, and the first single-layer trench is then filled in a first single-layer material deposition process. Laminate layer 522 is then formed on laminate layer 521, material is selectively removed from laminate layer 522 in a second material removal process to form a second single-layer trench, and the second single-layer trench is then filled in a second single-layer material deposition process. In such embodiments, suitable material removal processes include a laser ablation process, a mechanical drilling process, and a mechanical routing process, and suitable material deposition processes include a copper electroplating process. The embodiment of FIG. 5 illustrates inter-layer slot 510 spanning two laminate layers of PCB 200. However, in other embodiments, using the above techniques, inter-layer slot 510 can span three or more laminate layers and electrically conductive layers of PCB 200.

Inter-Layer Slot Formation

In some embodiments, an inter-layer slot as described herein is formed in one or more layers of a PCB by a process in which a plurality of overlapping vias are formed as a linear array. One such embodiment of an inter-layer slot is described below in conjunction with FIG. 6.

Figure 6:
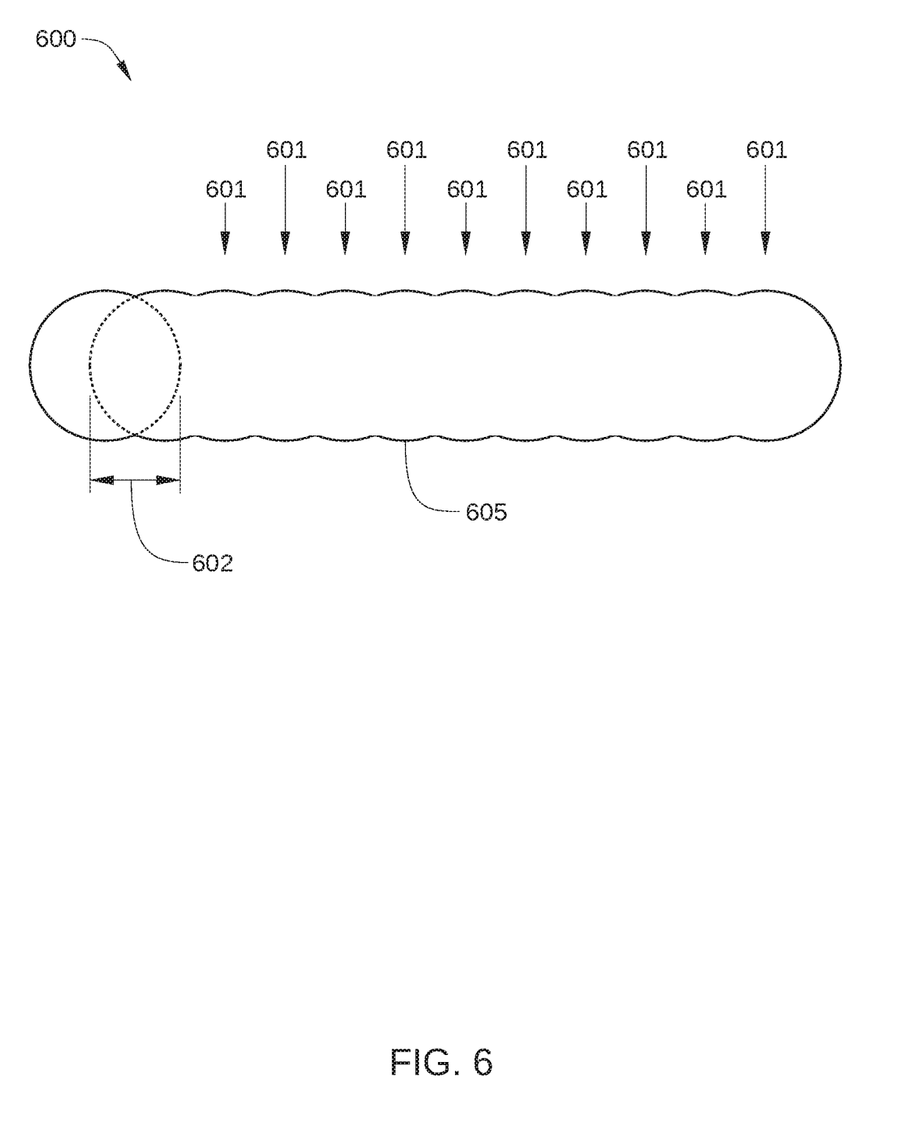
FIG. 6 illustrates an inter-layer slot, according to various embodiments.

FIG. 6 illustrates an inter-layer slot 600, according to various embodiments. In the embodiment illustrated in FIG. 6, inter-layer slot 600 is formed from a plurality holes 601 drilled through one or more laminate layers of a PCB. As noted previously, a laser ablation or mechanical drilling process may be employed to form each of holes 601. In the embodiment illustrated in FIG. 6, holes 601 are formed to have an overlap 602 that is 60% of the diameter of holes 601. In other embodiments, holes 601 are formed with an overlap 602 that is greater or smaller than 60% of the diameter of holes 601. For example, in some embodiments, holes 601 are formed with an overlap 602 of 50% of the diameter of holes 601. In embodiments in which overlap 602 is smaller than 60% of the diameter of holes 601, inter-layer slot 600 can be formed with fewer drilling operations. In embodiments in which overlap 602 is larger than 60% of the diameter of holes 601, walls 605 of inter-layer slot 600 are smoother and less likely to include sharp edges.

Figure 7:
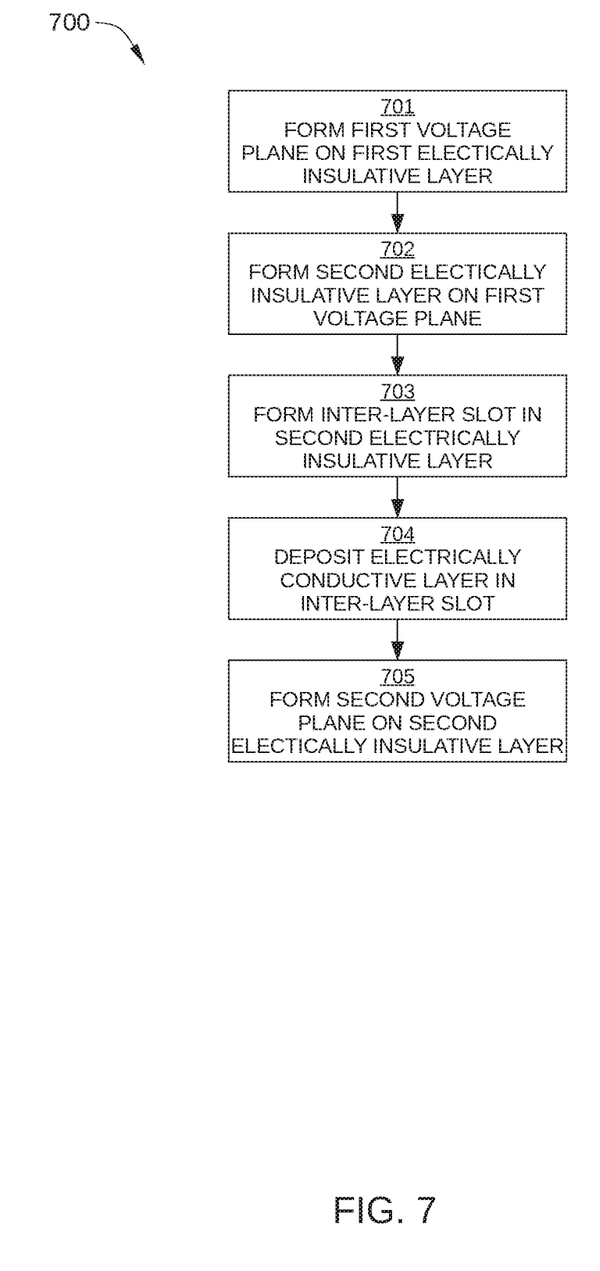
FIG. 7 sets forth a flowchart of method steps for forming an inter-layer slot to electrically connect two voltage planes, according to various embodiments.

FIG. 7 sets forth a flowchart of method steps for forming an inter-layer slot to electrically connect two voltage planes, according to various embodiments. Although the method steps are described with respect to the systems of FIGS. 1-6, any system configured to perform the method steps, in any order, falls within the scope of the various embodiments.

As shown, a method 700 begins at step 701, in which a first voltage plane is formed on a first laminate layer of a PCB. In some embodiments, an electrically conductive material is selectively deposited to form the first voltage plane, for example via a copper electroplating process. Alternatively, the electrically conductive material may be formed on the first laminate layer and portions thereof selectively removed.

In step 702, a second laminate layer is formed on the first voltage plane.

In step 703, an inter-layer slot is formed in the second laminate layer. In some embodiments, a plurality of overlapping holes are formed through the second laminate layer, for example via laser ablation or mechanical drilling. In some embodiments, the over-lapping holes forming the inter-layer slot are in a linear array. In some embodiments, the inter-layer slot has a high aspect ratio. For instance, in some embodiments, the inter-layer slot has a length that is ten to one hundred times or more greater than a width of the inter-layer slot.

In step 704, an electrically conductive material is deposited in the inter-layer slot. In some embodiments, the electrically conductive material is deposited so that few or no voids are formed in the inter-layer slot, since such voids can increase electrical resistance. Thus, in such embodiments, the inter-layer slot is filled with the electrically conductive material. Alternatively, in some embodiments, the inter-layer slot is filled using a non-conductive fill process, in which an inner portion of the inter-layer slot is filled with a dielectric material, such as epoxy, and a remainder portion of the inter-layer slot is filled with electrically conductive material. In some embodiments, a copper electroplating process is employed to deposit the electrically conductive material, and in other embodiments, any other conventional process for depositing the electrically conductive material is employed. It is noted that the electrically conductive material is electrically connected to the first voltage plane formed in step 701.

In step 705, a second voltage plane is formed on the second laminate layer. The second voltage plane may be formed via processes described above in conjunction with step 701. It is noted that the second voltage plane is electrically connected to the electrically conductive material formed in step 704.

In sum, the various embodiments shown and provided herein set forth an inter-layer slot formed through an electrically insulating layer of a PCB. The inter-layer slot includes an electrically conductive material that electrically couples a first voltage plane of the PCB to a second voltage plane of the PCB. The inter-layer slot serves as an electrical connection between the first voltage plane and the second voltage plane that has a larger cross-sectional area, and therefore less electrical resistance, than microvias employed in conventional PCBs.

At least one technical advantage of the disclosed printed circuit board design relative to the prior art is that the disclosed printed circuit board design provides reduced electrical resistance between conductive layers within the printed circuit board, such as two voltage planes that operate at the same voltage. The reduced electrical resistance reduces both the amount of power lost and the amount of heat generated when current flows through the two voltage planes during operation. These technical advantages provide one or more technological advancements over prior art approaches.

1. In some embodiments, a printed circuit board, comprises: a first voltage plane disposed on a first surface of a first electrically insulating layer; and a second voltage plane, wherein an inter-layer slot that is formed through the first electrically insulating layer and includes an electrically conductive material electrically couples the first voltage plane to the second voltage plane.

2. The printed circuit board of clause 1, wherein the second voltage plane is disposed on a second surface of the first electrically insulating layer.

3. The printed circuit board of clauses 1 or 2, further comprising a second electrically insulating layer, wherein the second voltage plane is disposed on a first surface of the second electrically insulating layer.

4. The printed circuit board of any of clauses 1-3, wherein the inter-layer slot also is formed through the second electrically insulating layer.

5. The printed circuit board of any of clauses 1-4, wherein the electrically conductive material comprises electroplated copper.

6. The printed circuit board of any of clauses 1-5, wherein the electroplated copper substantially fills the inter-layer slot.

7. The printed circuit board of any of clauses 1-6, wherein the first voltage plane comprises a ground plane or a power plane.

8. The printed circuit board of any of clauses 1-7, wherein the power plane is configured to be electrically coupled to a power source when the power source is mounted on the printed circuit board, and wherein the power plane is further configured to be electrically coupled to an integrated circuit when the integrated circuit is mounted on the printed circuit board.

9. The printed circuit board of any of clauses 1-8, wherein the ground plane is configured to be electrically coupled to a first integrated circuit when the integrated circuit is mounted on the printed circuit board.

10. The printed circuit board of any of clauses 1-9, wherein the ground plane is configured to be electrically coupled to a second integrated circuit when the integrated circuit is mounted on the printed circuit board.

11. The printed circuit board of any of clauses 1-10, further comprising a plurality of signal traces disposed on a second surface of the first electrically insulating layer and configured to be electrically coupled to an integrated circuit when the integrated circuit is mounted on the printed circuit board.

12. The printed circuit board of any of clauses 1-11, wherein the inter-layer slot comprises a plurality of overlapping holes formed through the first electrically insulating layer.

13. The printed circuit board of any of clauses 1-12, wherein each overlapping hole included in the plurality of overlapping holes overlaps an adjacent hole also included in the plurality of overlapping holes by at least about 50% of the diameter of the adjacent hole.

14. In some embodiments, a method for manufacturing a printed circuit board, the method comprises: forming an inter-layer slot through a first layer of electrically insulating material via a plurality of overlapping holes formed through the first layer of electrically insulating layer; depositing an electrically conductive material within the inter-layer slot; forming a first voltage plane on a first surface of the first layer; and forming a second voltage plane that is electrically coupled to the first voltage plane via the electrically conductive material within the inter-layer slot.

15. The method of clause 14, further comprising forming the plurality of overlapping holes via one of a laser ablation process, a mechanical drilling process, or a mechanical routing process.

16. The method of clauses 14 or 15, wherein depositing the electrically conductive material within the inter-layer slot comprises substantially filling the inter-layer slot with electroplated copper.

17. The method of any of clauses 14-16, further comprising forming a second layer of electrically insulating material, wherein the second voltage plane is formed on a second surface of the second layer.

18. The method of any of clauses 14-17, further comprising forming the inter-layer slot in the second layer.

19. The method of any of clauses 14-18, wherein the inter-layer slot is formed in the first layer and in the second layer in a single material removal process.

20. The method of any of clauses 14-19, wherein the inter-layer slot is formed in the first layer in a first material removal process and the inter-layer slot is formed in the second layer in a second material removal process.

Any and all combinations of any of the claim elements recited in any of the claims and/or any elements described in this application, in any fashion, fall within the contemplated scope of the present invention and protection.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "module" or "system." In addition, any hardware and/or software technique, process, function, component, engine, module, or system described in the present disclosure may be implemented as a circuit or set of circuits. Furthermore, aspects of the present disclosure may take the form of a computer program product embodied in at least one computer readable medium having computer readable program code embodied thereon.

Any combination of at least one computer readable medium may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having at least one wire, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable processors or gate arrays.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises at least one executable instruction for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure may be devised without departing from the basic scope thereof, and the scope thereof is determined by the claims that follow.

What is claimed is:

1. A printed circuit board, comprising:
a first power plane disposed on a first surface of a first electrically insulating layer; and
a second power plane that includes one or more signal traces, wherein a thickness of the second power plane is about half a thickness of the first power plane,
wherein an inter-layer slot that is formed through the first electrically insulating layer and includes an electrically conductive material electrically couples the first power plane to the second power plane, and wherein the first power plane and the second power plane are configured to conduct power between two or more devices coupled to the printed circuit board.

2. The printed circuit board of claim 1, wherein the second power plane is disposed on a second surface of the first electrically insulating layer.

3. The printed circuit board of claim 1, further comprising a second electrically insulating layer, wherein the second power plane is disposed on a first surface of the second electrically insulating layer.

4. The printed circuit board of claim 3, wherein the inter-layer slot also is formed through the second electrically insulating layer.

5. The printed circuit board of claim 1, wherein the electrically conductive material comprises electroplated copper.

6. The printed circuit board of claim 5, wherein the electroplated copper substantially fills the inter-layer slot.

7. The printed circuit board of claim 1, wherein the first power plane is configured to be electrically coupled to a power source when the power source is mounted on the printed circuit board, and wherein the first power plane is further configured to be electrically coupled to an integrated circuit when the integrated circuit is mounted on the printed circuit board.

8. The printed circuit board of claim 1, wherein a ground plane is configured to be electrically coupled to a first integrated circuit when the integrated circuit is mounted on the printed circuit board.

9. The printed circuit board of claim 8, wherein the ground plane is configured to be electrically coupled to a second integrated circuit when the integrated circuit is mounted on the printed circuit board.

10. The printed circuit board of claim 1, wherein the one or more signal traces of the second power plane are disposed on a second surface of the first electrically insulating layer and configured to be electrically coupled to an integrated circuit when the integrated circuit is mounted on the printed circuit board.

11. A printed circuit board, comprising:
a first power plane disposed on a first surface of a first electrically insulating layer; and
a second power plane,
wherein an inter-layer slot that is formed through the first electrically insulating layer and includes an electrically conductive material electrically couples the first power plane to the second power plane, wherein the first power plane and the second power plane are configured to conduct power between two or more devices coupled to the printed circuit board, and wherein the inter-layer slot comprises a plurality of overlapping holes formed through the first electrically insulating layer.

12. The printed circuit board of claim 11, wherein each overlapping hole included in the plurality of overlapping holes overlaps an adjacent hole also included in the plurality of overlapping holes by at least about 50% of the diameter of the adjacent hole.

13. A method for manufacturing a printed circuit board, the method comprising:
forming an inter-layer slot through a first layer of electrically insulating material via a plurality of overlapping holes formed through the first layer of electrically insulating material;
depositing an electrically conductive material within the inter-layer slot;
forming a first power plane on a first surface of the first layer; and
forming a second power plane that is electrically coupled to the first power plane via the electrically conductive material within the inter-layer slot, wherein the first power plane and the second power plane are configured to conduct power between two or more devices coupled to the printed circuit board.

14. The method of claim 13, further comprising forming the plurality of overlapping holes via one of a laser ablation process, a mechanical drilling process, or a mechanical routing process.

15. The method of claim 13, wherein depositing the electrically conductive material within the inter-layer slot comprises substantially filling the inter-layer slot with electroplated copper.

16. The method of claim 13, further comprising forming a second layer of electrically insulating material, wherein the second power plane is formed on a second surface of the second layer.

17. The method of claim 16, further comprising forming the inter-layer slot in the second layer.

18. The method of claim 17, wherein the inter-layer slot is formed in the first layer and in the second layer in a single material removal process.

19. The method of claim 17, wherein the inter-layer slot is formed in the first layer in a first material removal process and the inter-layer slot is formed in the second layer in a second material removal process.

20. A method for manufacturing a printed circuit board, the method comprising:
forming a first voltage plane on a surface of a first layer of an electrically insulating material;
forming a second layer of an electrically insulating material on the first voltage plane;
removing a first portion of the second layer from a first surface of the second layer opposite to the first voltage plane to form an inter-layer slot through the second layer revealing a portion of the first voltage plane;
depositing first electrically conductive material within the inter-layer slot; and
depositing second electrically conductive material on the first surface of the second layer and the first electrically conductive material within the inter-layer slot to form a second voltage plane that electrically couples the second voltage plane to the first voltage plane via the first electrically conductive material within the inter-layer slot.

21. The method of claim 20, wherein removing the first portion of the second layer comprises forming a plurality of overlapping holes through the second layer of the electrically insulating material.

22. The method of claim 20, wherein removing the first portion of the second layer comprises removing the first portion from the first surface of the second layer without removing the first voltage plane.

\* \* \* \* \*